(12) United States Patent
Schmidhammer

(10) Patent No.: US 9,197,186 B2
(45) Date of Patent: Nov. 24, 2015

(54) DUPLEXER WITH PHASE SHIFTER CIRCUIT

(71) Applicant: EPCOS AG, München (DE)

(72) Inventor: Edgar Schmidhammer, Stein an der Traun (DE)

(73) Assignee: EPCOS AG, Munich (DE)

( * ) Notice: Subject to any disclaimer, the term of this patent is extended or adjusted under 35 U.S.C. 154(b) by 42 days.

(21) Appl. No.: 13/958,466

(22) Filed: Aug. 2, 2013

(65) Prior Publication Data
US 2014/0043113 A1    Feb. 13, 2014

(30) Foreign Application Priority Data
Aug. 7, 2012   (DE) .......................... 10 2012 107 244

(51) Int. Cl.
*H01P 5/18*  (2006.01)
*H03H 7/01* (2006.01)
*H03H 7/46* (2006.01)

(52) U.S. Cl.
CPC  *H03H 7/01* (2013.01); *H03H 7/463* (2013.01)

(58) Field of Classification Search
CPC .......................................................... H03H 7/01
USPC .................................. 333/124–129, 132–134
See application file for complete search history.

(56) References Cited

U.S. PATENT DOCUMENTS

| | | | |
|---|---|---|---|
| 7,825,745 B1* | 11/2010 | Gavin et al. .................... | 333/132 |
| 8,022,787 B2* | 9/2011 | Inoue et al. .................... | 333/110 |
| 2009/0179714 A1* | 7/2009 | Ali-Ahmad et al. .......... | 333/189 |
| 2010/0148886 A1 | 6/2010 | Inoue et al. | |
| 2011/0187478 A1 | 8/2011 | Link et al. | |

FOREIGN PATENT DOCUMENTS

DE    102008045346 A1    3/2010

* cited by examiner

*Primary Examiner* — Dinh Le
(74) *Attorney, Agent, or Firm* — McDermott Will & Emery LLP

(57) ABSTRACT

A duplexer comprising an improved matching circuit for matching between transmitting path and receiving path is specified. In this case, the matching circuit comprises a hybrid and matching elements.

10 Claims, 3 Drawing Sheets

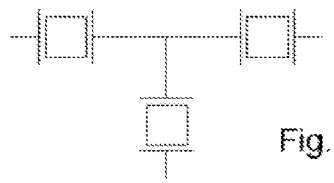
Fig. 5
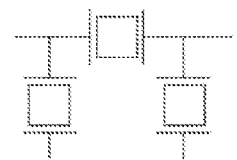
Fig. 6
Fig. 7
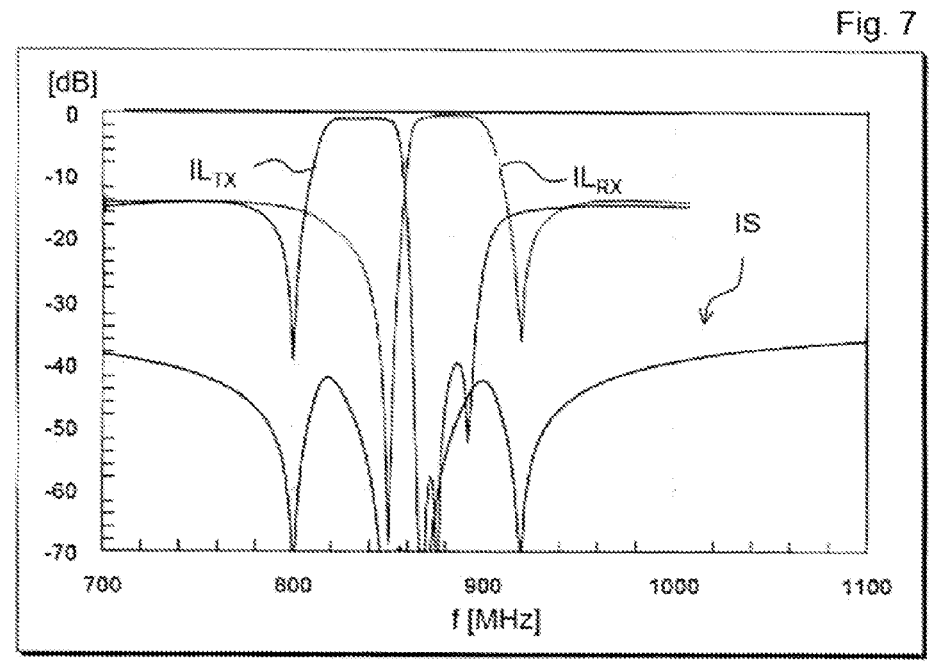
Fig. 8
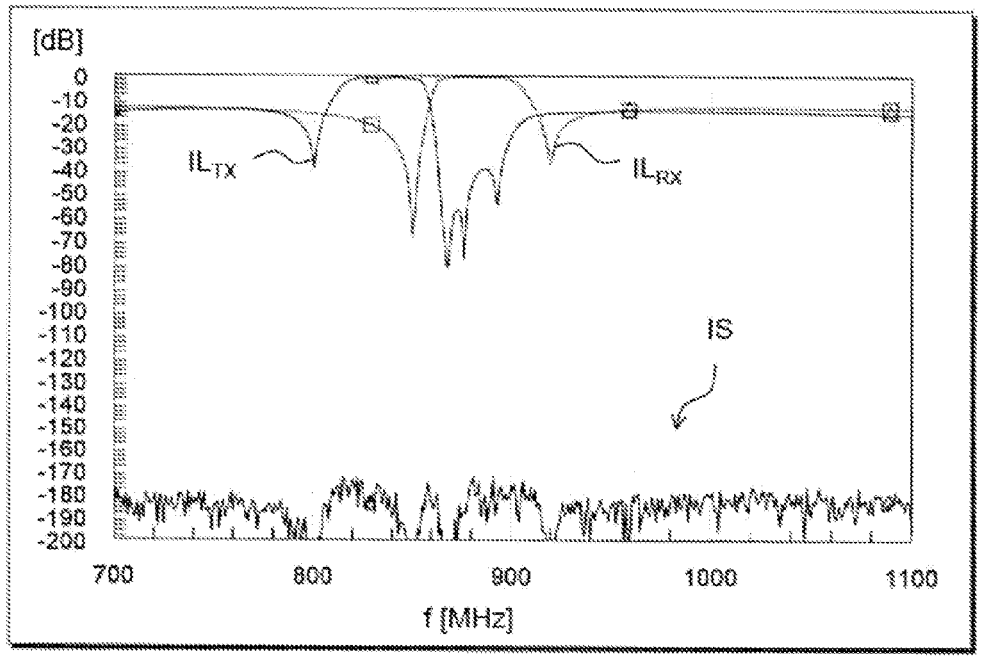

DUPLEXER WITH PHASE SHIFTER CIRCUIT

CROSS-REFERENCE TO RELATED APPLICATIONS

This application claims priority to German Patent Application No. 10 2012 107 244.2 filed on Aug. 7, 2012, the disclosure of which is incorporated herein by reference in its entirety.

The invention relates to duplexers, e.g. for mobile communication devices, which comprise a phase shifter circuit in order to match impedances of transmission and reception signal paths.

Duplexers usually comprise a transmitting filter in a transmission signal path and a receiving filter in a reception signal path. In general, it is not readily possible to interconnect these two filters directly with a common terminal, e.g. an antenna terminal. Therefore, in duplexers a matching circuit is usually provided between transmitting filter and receiving filter. A matching circuit can consist of or comprise a phase shifter circuit. The matching circuit increases the isolation between transmission signal path and reception signal path to values that fulfill predefined specifications.

US 2010/0148886 A1 discloses, for example, a duplexer comprising a phase shifter circuit as matching element. In this case, the phase shifter circuit comprises a 0°/90° 3 dB hybrid having four terminals. The first terminal is interconnected with an antenna, while the fourth terminal is interconnected with the transmission signal path. Terminals two and three are in each case interconnected with a balanced guided line of the reception signal path.

It is desirable to be able to choose from a large number of duplexers in order to be able to comply with specifications regarding the isolation that are applicable nowadays or in the future.

It is therefore an object of the present invention to specify alternative duplexers comprising phase shifter circuits. It is an object, in particular, to specify duplexers having improved, i.e. increased, isolation between transmission signal path and reception signal path.

This object is achieved by means of the duplexer according to claim 1. In this case, dependent claims specify advantageous configurations of the invention.

A duplexer that fulfills these objects comprises an antenna port, a transmitting port and a receiving port. The duplexer furthermore comprises a hybrid interconnected with the antenna port, the transmitting port and the receiving port. The duplexer furthermore comprises a transmitting filter in a transmission signal path between the hybrid and the transmitting port. A receiving filter of the duplexer is interconnected in a reception signal path between the hybrid and the receiving port. In this case, the reception signal path comprises two conductor sections connected in parallel. A matching element is interconnected between the transmitting port and the hybrid and/or between the receiving port and the hybrid.

In this case, the hybrid and the matching element constitute the phase shifter circuit of the duplexer. A hybrid within the meaning of the invention can in this case be an RF power divider circuit having four terminals. One port of the hybrid can furthermore be interconnected with the transmitting port. A further port, e.g. a third port, can in this case be interconnected with an antenna path of the duplexer and be provided for distributing received RF signals between a second port and a fourth port. In this case, there can be a phase difference between these two output signals. These two ports two and four can then be interconnected with the receiving port of the duplexer.

It has been discovered that the provision of a matching element in the phase shifter circuit can drastically improve the isolation of the duplexer.

In one embodiment, the duplexer correspondingly comprises a hybrid having a first, second, third and fourth port. The first port is an input port and can be interconnected e.g. with the transmission signal path. The second port and the fourth port can be an output port of the hybrid, wherein there is a phase difference of approximately 90° or of approximately 180° between output signals of the second and fourth ports.

A so-called balanced/unbalanced duplexer can be obtained with such a matching circuit comprising a hybrid. In this case, the reception signal port can comprise balanced guided signal lines interconnected with the hybrid. Balanced guided signal lines have a significantly lower susceptibility toward common-mode interference. The hybrid having the two output ports two and four in this case constitutes a simple but effective measure for dividing unbalanced guided RF signals originating from an antenna between the two balanced guided signal lines of the unbalanced/balanced duplexer.

In one embodiment, the reception signal path is correspondingly provided for guiding balanced guided RF signals.

In one embodiment, the duplexer comprises a matching element in particular between the transmitting port and the transmitting filter and/or between the transmitting filter and the hybrid. The matching element can be the abovementioned matching element or a further matching element.

The matching element can comprise, in particular, a stripline or capacitive or inductive circuit elements.

In one embodiment, the duplexer comprises a matching element between the hybrid and the receiving filter and/or between the receiving filter and the receiving port. In this case, the matching element can in turn be the matching element mentioned in the introduction or else an additional matching element.

In one embodiment, the matching element is, in particular, a capacitive element, an inductive element or a stripline. The matching element can also comprise an interconnection with a capacitive element, an inductive element or a stripline.

In one embodiment, the transmitting filter and/or the receiving filter operate(s) with acoustic waves. In particular, components operating with surface acoustic waves (SAW), with bulk acoustic waves (BAW) or with guided surface acoustic waves (GBAW=Guided Bulk Acoustic Waves) are appropriate as filters.

There are filters operating with acoustic waves and having intrinsic balun (balanced/unbalanced transformer) functionality. Such filters are, for example, so-called DMS (DMS=Double Mode Surface Acoustic Wave) filters. The provision of a hybrid for generating output signals having a phase difference in this case makes it superfluous to use such relatively complex and therefore generally expensive components. In particular the use of CRF (CRF=Coupled Resonator Filter) operating with BAW (BAW=Bulk Acoustic Wave) or the use of further balun circuits can be dispensed with.

In one embodiment, the hybrid comprises coupled transformers. In this case, such a hybrid comprises coils or windings that are electromagnetically coupled to one another. The number of windings of the coil which is interconnected with a respective one of the terminals can be set individually in this case. It is thus readily possible to set the impedance level of each individual terminal. Particularly if the reception signal path and the transmission signal path are galvanically isolated by the provision of coupled transformers in the hybrid, very high isolation values are obtained.

Furthermore it is possible in a simple manner for the output of the hybrid that is interconnected with the transmission signal path to be designed with low impedance.

The turns ratio of the coupled transformers can be 0.5. Thus, the impedance of the transmitting port can be set to 25 ohms, the impedance of the two balanced guided signal lines of the receiving port can be set to 100 ohms and the terminal of the hybrid that is interconnected with the antenna can be set to 50 ohms.

Duplexers comprising phase shifter circuits are explained in greater detail below on the basis of exemplary embodiments and associated schematic figures. In this case, different figures illustrate different aspects of the invention, which, of course, are not mutually exclusive but rather can be combined with one another.

In the figures:

FIG. 1 shows: a configuration of a duplexer comprising a transmitting port TP, a receiving port RP and a hybrid H between the transmitting port and the receiving port, FIG. 2 shows: a configuration of a duplexer, wherein matching elements ME can optionally be provided, FIG. 3 shows: a configuration of a duplexer comprising two balanced guided signal lines between hybrid H and receiving port RP, FIG. 4 shows: the configuration of a duplexer whose hybrid H operates with coupled transformers, FIG. 5 shows: a T-circuit with resonators, FIG. 6 shows: a Π-circuit with resonators, FIG. 7 shows: the insertion losses of the transmission signal path (TX) and of the reception signal path (RX) and also the isolation therebetween for a configuration of a duplexer, FIG. 8 shows: insertion losses and isolation for one particularly advantageous embodiment of a duplexer.

FIG. 1 shows an embodiment of a duplexer DU comprising a transmitting port TP, an antenna port AP and a receiving port RP. A transmitting filter FTX is interconnected between the transmitting port TP and the antenna port AP. The signal path from the antenna port AP to the receiving port RP is embodied as balanced and thus comprises two signal lines connected in parallel. A receiving filter FRX1, FRX2 is interconnected in each of the two signal lines. A matching element ME is furthermore interconnected in the signal line in which the receiving filter FRX1 is interconnected. Consequently, the receiving filters FRX1, FRX2 and the matching element ME are interconnected between the antenna port AP and the receiving port RP. Furthermore, a matching element ME is interconnected between the antenna port AP and the transmitting port TP. The interconnection of receiving port RP, transmitting port TP and antenna port AP is effected via a hybrid H. The hybrid H has four ports or terminals. Via a first terminal, the hybrid H is interconnected with the transmitting port TP. Transmission signals are conducted from the transmitting port TP into the hybrid 1. Consequently, the first terminal of the hybrid is an input port. Signals received by the antenna are transmitted via the output ports two and four of the hybrid to the receiving port RP. The third port of the hybrid is interconnected with the antenna port AP. The hybrid H brings about a phase difference between the output signals present at the ports two and four of the hybrid H, such that balanced guided signals are present at the receiving port RP. If the hybrid H is a 90° hybrid, then the matching element ME between the receiving filter FRX1 and the receiving port RP can carry out a further phase rotation by 90° such that a phase difference of substantially 180° is present at the receiving port RP. If the hybrid H already provides a phase difference of 180° then there is no need for a further phase rotation in the reception signal path.

FIG. 2 shows an embodiment of a duplexer, wherein additional matching elements ME can optionally be interconnected in the signal paths. A matching element ME can be interconnected between the transmitting filter FTX and the transmitting port TP. A further matching element ME can be interconnected between the fourth port of the hybrid and the receiving filter FRX1. A further matching element ME can be interconnected between the second port of the hybrid and the receiving filter FRX2. The matching element ME between the receiving filter FRX1 and the receiving port RP is also optional, as is the matching element ME between the receiving filter FRX2 and the receiving port RP.

The hybrid in FIG. 2 can be, in particular, a 90° hybrid.

FIG. 3 shows a configuration of a duplexer DU, wherein the hybrid can be a 180° hybrid. The hybrid H has a first port, via which it is interconnected with the antenna port AP. Via its second port, the hybrid H is interconnected with the transmitting filter FTX between hybrid H and transmitting port TP. Via its third port, the hybrid H is interconnected with a first signal line of the balanced guided reception signal path. With its fourth port, the hybrid is interconnected with the second signal line of the reception signal path. In the first signal line of the reception signal path, a receiving filter FRX1 is arranged between two matching elements ME. Alongside the receiving filter FRX2, the second signal line of the reception signal path can comprise further matching elements, e.g. between the hybrid and the receiving filter FRX2 or between the receiving filter FRX2 and the receiving port RP.

FIG. 4 shows a configuration of a duplexer DU, wherein the hybrid H comprises coupled transformers, e.g. two coupled transformers. The coupled transformers in each case comprise electromagnetically coupled windings or coils. Thus, one terminal of a coil can be interconnected with a first port of the hybrid H, while the respective other terminal of the coil is interconnected with the second port of the hybrid H. One terminal of the coil coupled to said coil is interconnected with the third port of the hybrid H, while the other terminal of the coil is interconnected with the fourth port of the hybrid H. It is possible for the second port of the hybrid H to be interconnected with ground. The first port of the hybrid H is interconnected with the antenna port AP. The fourth port of the upper coupled transformer and the third port of the lower coupled transformer are interconnected with the transmitting path TP. The third port of the upper coupled transformer and the fourth port of the lower coupled transformer are in each case interconnected with the balanced guided signal lines of the reception signal path and thus with the receiving port RP. Once again, a respective receiving filter FRX1, FRX2 is interconnected in each of the reception signal lines of the reception signal path. Moreover, these signal lines can contain matching elements ME between the hybrid and the corresponding receiving filter FRX1, FRX2 or the corresponding filter and the receiving port RP.

FIG. 5 shows a basic form of a filter comprising resonators, which filter can be used for example as a transmitting filter. In this case, FIG. 5 shows a so-called T-circuit comprising resonators.

FIG. 6 shows a so-called π-circuit comprising resonators, which can constitute, in particular, a basic element of a receiving filter.

Figure 1:
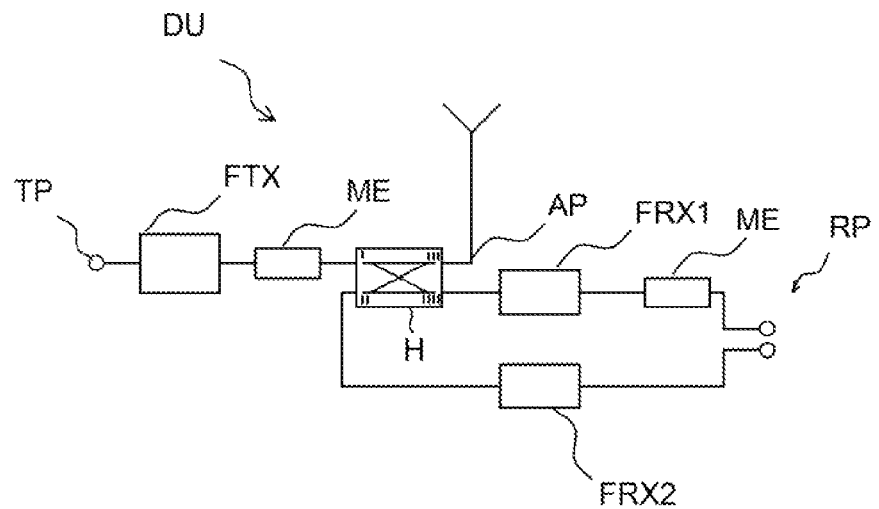
Figure 2:
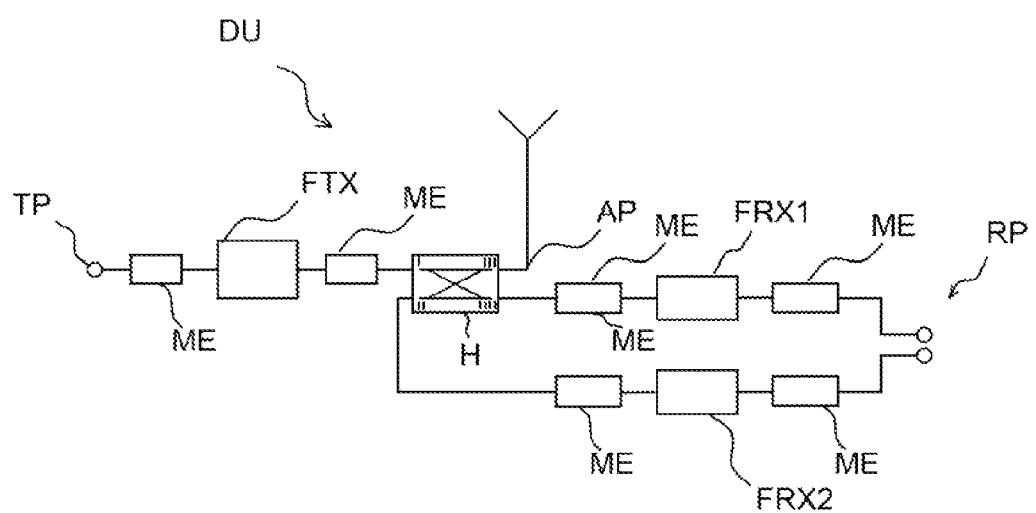
Figure 3:
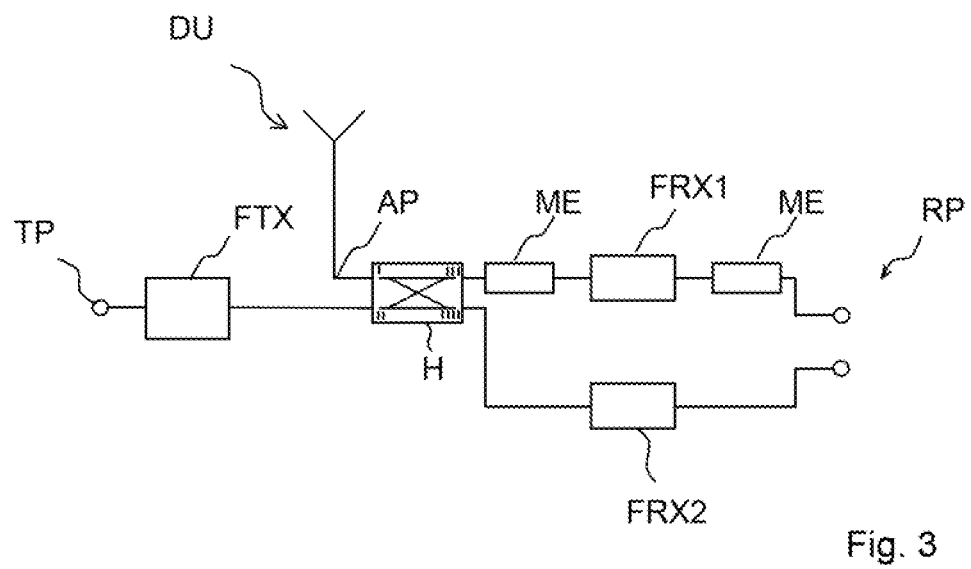
Figure 4:
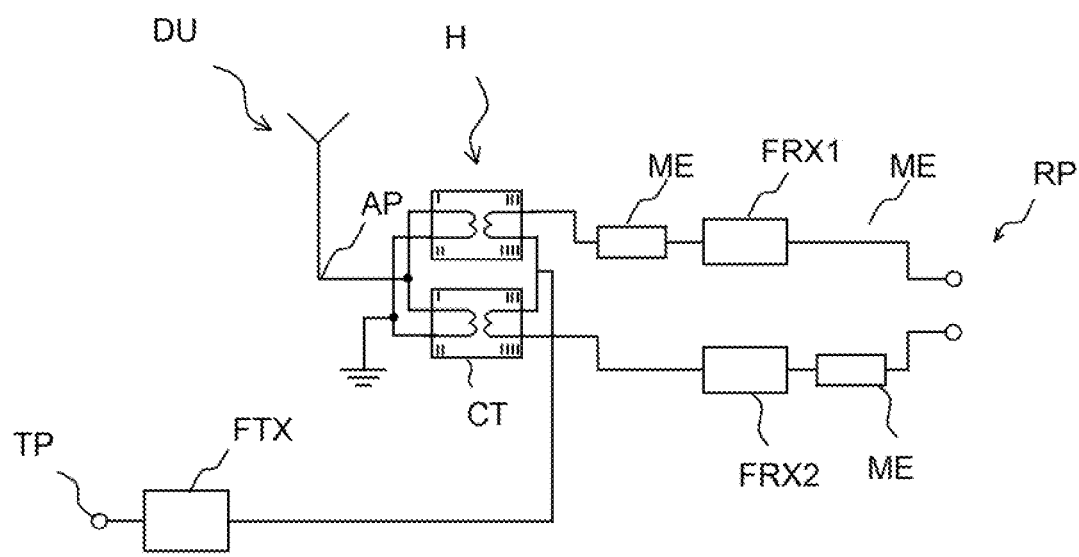

The resonators of the filters in FIGS. 5 and 6 can in this case be resonators operating with acoustic waves, such as SAW resonators, BAW resonators or GBAW resonators.

FIG. 7 shows the insertion loss $IL_{TX}$ of the transmission signal path and the insertion loss $IL_{RX}$ of the reception signal path. Furthermore, curve IS shows the isolation between transmitting port and receiving port. FIG. 7 in this case shows characteristic curves of a duplexer comprising a matching circuit, wherein a hybrid is interconnected in the matching circuit.

FIG. 8 shows the corresponding curves of the insertion losses and the isolation IS of a duplexer comprising a particularly powerful matching circuit. In this case, the isolation is substantially frequency-independent and better than −160 dB over the entire relevant frequency range. Such an insertion loss also appears to be able to comply well with future specifications.

The excellent performance of the duplexer, the characteristic curves of which are shown in FIG. 8, is based in this case on the use of coupled transformers in the hybrid.

A duplexer according to the invention is not restricted in this case to one of the exemplary embodiments described. Combinations of described features and variations which comprise e.g. even further matching elements likewise constitute exemplary embodiments according to the invention.

The invention claimed is:

1. A duplexer, comprising:
   an antenna port for receiving an RF input signal, a transmitting port, a first receiving port and a second receiving port;
   a hybrid; a transmitting filter in a transmission signal path between the hybrid and the transmitting port; and
   a first receiving filter in a first reception signal path between the hybrid and the first receiving port,
   a second receiving filter in a second receiving path between the hydrid and the second receiving port,
   wherein a matching element is interconnected between the transmitting port and the hybrid or between the receiving ports and the hybrid;
   wherein the hybrid comprises a first, second, third and fourth port,
   wherein the third port is interconnected with the antenna port,
   wherein the second port and the fourth port are interconnected with the receiving ports, and
   wherein the first port is an input port which is interconnected with the transmitting port and a phase difference between output signals of the second and fourth ports is approximately 180°.

2. The duplexer according to claim 1, wherein the reception signal path is provided for balancing the output signals.

3. The duplexer according to claim 1, further comprising the matching element between the transmitting port and the transmitting filter or between the transmitting filter and the hybrid.

4. The duplexer according to claim 1, further comprising the matching element between the hybrid and the receiving filter or between the receiving filter and the receiving port.

5. The duplexer according to claim 1, wherein the matching element is selected from: a capacitive element, an inductive element, or a stripline.

6. The duplexer according to claim 1, wherein the transmitting filter or the receiving filter operates with surface acoustic waves, with bulk acoustic waves or with guided bulk acoustic waves.

7. The duplexer according to claim 1, wherein the hybrid comprises coupled transformers.

8. The duplexer according to claim 7, wherein a turn ratio of the coupled transformers is 0.5.

9. The duplexer according to claim 1, wherein the antenna port has an impedance of 100Ω, the transmitting port has an impedance of 25Ω and the receiving ports have an impedance of 100 Ω.

10. The duplexer according to claim 1, wherein the duplexer is configured for use in a mobile communication device.

* * * * *